United States Patent
Sohn et al.

(10) Patent No.: US 9,735,826 B2
(45) Date of Patent: Aug. 15, 2017

(54) NOISE SHIELDING DEVICE WITH HEAT DISSIPATION STRUCTURE AND ELECTRONIC DEVICE HAVING THE SAME

(71) Applicant: Samsung Electronics Co., Ltd., Gyeonggi-do (KR)

(72) Inventors: Jongryul Sohn, Gyeonggi-do (KR); Cheolwoong Park, Gyeonggi-do (KR); Hosoo Seo, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/090,772

(22) Filed: Apr. 5, 2016

(65) Prior Publication Data

US 2016/0301442 A1    Oct. 13, 2016

(30) Foreign Application Priority Data

Apr. 8, 2015    (KR) .................. 10-2015-0049610

(51) Int. Cl.
| | |
|---|---|
| H04M 1/00 | (2006.01) |
| H04B 1/3888 | (2015.01) |
| H05K 7/20 | (2006.01) |
| H05K 9/00 | (2006.01) |
| H04M 1/19 | (2006.01) |
| H05K 1/02 | (2006.01) |

(52) U.S. Cl.
CPC ............ *H04B 1/3888* (2013.01); *H04M 1/19* (2013.01); *H05K 7/20445* (2013.01); *H05K 9/0032* (2013.01); *H05K 1/0216* (2013.01); *H05K 2201/10371* (2013.01)

(58) Field of Classification Search
CPC ...................................................... H04B 1/3888
USPC ........................................................ 455/575.8
See application file for complete search history.

(56) References Cited

U.S. PATENT DOCUMENTS

| | | | | |
|---|---|---|---|---|
| 6,084,178 A | * | 7/2000 | Cromwell | ............... H01L 23/32 174/16.3 |
| 2010/0102442 A1 | * | 4/2010 | Sung | .................. H01L 23/3732 257/720 |
| 2014/0181685 A1 | * | 6/2014 | Lee | ...................... G06F 3/0488 715/747 |
| 2014/0313680 A1 | | 10/2014 | Kil et al. | |

FOREIGN PATENT DOCUMENTS

KR    10-2014-0126507 A    10/2014

* cited by examiner

*Primary Examiner* — Sanh Phu
(74) *Attorney, Agent, or Firm* — Cha & Reiter, LLC.

(57) ABSTRACT

An electronic device may include a noise shielding device that may include: a substrate including at least one heat generating component; a metallic shield cover that is disposed on the substrate to enclose the at least one heat generating component; a metal housing disposed around the shield cover; and a heat transfer member that is configured to transfer heat emitted from the heat generating component through an opening formed at a position corresponding to the heat generating component to the metal housing, wherein the metallic shield cover includes a plurality of tension fingers that protrude at predetermined intervals and contact a bottom face of the metal housing, and noise emitted from the heat generating component is shielded by a shielding region that is formed by the tension fingers and the metal housing.

20 Claims, 15 Drawing Sheets

NOISE SHIELDING DEVICE WITH HEAT DISSIPATION STRUCTURE AND ELECTRONIC DEVICE HAVING THE SAME

CLAIM OF PRIORITY

This application claims the priority under 35 U.S.C. §119(a) to Korean Application Serial No. 10-2015-0049610, which was filed in the Korean Intellectual Property Office on Apr. 8, 2015, the entire contents of which are hereby incorporated by reference.

TECHNICAL FIELD

Various embodiments of the present disclosure relate to a noise shielding device having a heat dissipation structure, and to an electronic device that includes the noise shielding device.

BACKGROUND

An electronic device may be an important means for delivering various pieces of information to a user. In the electronic device, information may be displayed to the user through a display of an external electronic device that is functionally connected to the electronic device. As the kinds of external electronic devices, which may be connected to the electronic device so as to display information, are diversified, the electronic device may provide the information in various types to improve the user's convenience. In addition, the electronic device may provide various input means (e.g., a touch and a gesture) for receiving a user's input related to the information.

In general, the electronic device performs the above-mentioned various functions by a processor (e.g., an AP or a CP) that is mounted therein with high-temperature heat being generated from the processor. Since the high-temperature heat has a bad influence on a peripheral electronic component, it is preferable to have an efficient heat dissipation structure.

Recently, research has been actively conducted on a structure that distributes and dissipates heat generated from a heat generating component, such as the above-mentioned processor, by using various metal housings that are mounted on a substrate.

In general, a heat generating component, which is provided to an electronic device, may be mounted on a substrate, and transfers high-temperature to any other electronic component around the heat generating component to have an have a bad influence on the electronic component, thereby degrading the whole performance of the electronic device or causing the electronic device to malfunction. In order to solve such a problem, the heat generating component may have a structure that is in physical contact with a metal housing (e.g., a metal bracket) that is disposed around the heat generating component so as to dissipate the heat.

For example, such a heat generating component may generate a noise, and the electronic device may include a noise shielding device to efficiently shield the noise generated from the heat generating component. According to one embodiment, such a noise shielding device may include a shield cover that is installed on the substrate to enclose the heat generating component. However, since the shield cover is disposed to entirely enclose the heat generating component, there is a problem in that it is difficult for the shield cover to have a heat dissipation structure that efficiently dissipates the heat to the outside of the shield cover.

In order to solve such a problem, an efficient heat dissipation structure may be provided by forming an opening in a region of the shield cover, which corresponds to the heat generating component, and making the heat generating component and an external metal housing be in contact with each other through the opening. However, such a structure cannot efficiently shield noise that is emitted from the heat generating component through the opening. In particular, electronic components around the heat generating component (e.g., an antenna radiator) may suffer from a degradation of the radiation performance by the influence of the noise, which may cause a performance degradation of the electronic device. In order to solve such a problem, the opening may be shielded from the outside by forming a separate conductive member (e.g., a conductive tape) along the periphery of the opening or attaching the conductive element along an upper outer periphery of the shield cover, and making the conductive member be in contact with the metal housing outside the shield cover, so that the noise can be efficiently shielded.

However, this method may cause separate additional costs and processes by introducing the separate conductive member. In addition, since the conductive member should have a predetermined thickness (in the case where the conductive member is a conductive sponge, the conductive sponge should have a thickness of 0.4 mm or more and a compressibility of about 50%), it may cause a problem of increasing the entire thickness of the electronic device. Furthermore, depending on the manufacturing processes, the noise shielding performance may not be regularly ensured due to the deviation in compressibility that is caused by the manufacturing tolerance of the metal housing or a PCB.

Nothing in the background section is to be construed as prior art unless otherwise indicated.

SUMMARY

Various embodiments of the present disclosure have been made to solve the above-mentioned and other problems, and may provide a noise shielding device that has a heat dissipation structure, and an electronic device that includes the noise shielding device.

Various embodiments of the present disclosure may provide a noise shielding device that may have a heat dissipation structure that does not use a separate conductive member so that the costs can be reduced and an additional working process can be excluded, and may provide an electronic device that includes the noise shielding device.

In various embodiments of the present disclosure, a noise shielding device may include a heat dissipation structure that can always maintain a regular noise shielding performance, thereby helping to secure the reliability of an electronic device, and may provide an electronic device that includes the noise shielding device.

In various embodiments of the present disclosure, a noise shielding device may efficiently shield noise and can reduce the entire thickness of an electronic device to contribute to the slimming of the electronic device, and may provide an electronic device that includes the noise shielding device.

In various embodiments, a noise shielding device and an electronic device may include a noise shielding device that may include: a substrate that includes at least one heat generating component; a metallic shield cover that may be disposed on the substrate to enclose the heat generating component; a metal housing that may be disposed around the shield cover; and a heat transfer member that transfers heat, which may be emitted from the heat generating component through an opening formed at a position corresponding to the heat generating component of the shield cover, to the metal housing. The shield cover may include a plurality of tension fingers that are formed to protrude at predetermined intervals to be in contact with a bottom face of the metal housing, and noise emitted from the heat generating component may be shielded by a shielding region that may be formed by the tension fingers and the metal housing.

According to various embodiments of the present disclosure, an electronic device may include a noise shielding device that may include: a substrate that includes at least one heat generating component; a metallic shield frame that includes an internal region in which the heat generating component may be disposed, on the substrate; a metal housing that may be disposed around the shield frame; and a heat transfer member that transfers heat generated from the heat generating component to the metal housing. The shield frame may include a plurality of tension fingers that are formed to protrude at predetermined intervals to be in contact with a bottom face of the metal housing, and noise emitted from the heat generating component may be shielded by a shielding region that may be formed by the tension fingers and the metal housing.

According to various embodiments, an electronic device may include: a substrate that includes at least one heat generating component; a metallic shield frame that includes an internal region in which the heat generating component may be disposed, on the substrate; a metallic shield cover that may be disposed on the substrate to enclose the heat generating component, and may be fixed to the shield frame; a metal housing that may be disposed around the shield cover; and a heat transfer member that transfers heat, which may be emitted from the heat generating component through an opening formed at a position corresponding to the heat generating component of the shield cover, to the metal housing. The shield frame may include a plurality of tension fingers that are formed to protrude at predetermined intervals and penetrate finger through-holes formed in the shield cover at corresponding positions to be in contact with a bottom face of the metal housing, and noise emitted from the heat generating component may be shielded by a shielding region that may be formed by the tension fingers and the metal housing.

According to various embodiments, there may be provided an electronic device for mobile communication that may include: a processor module that processes data within the electronic device; a sound output unit that outputs processed sound data; a power supply that may be electrically connected to the electronic device to supply power; a voice input unit that receives a voice signal from the outside of the electronic device; an image input unit that receives an image signal; a communication unit that exchanges data with another electronic device; a substrate that includes at least one heat generating component; a metallic shield cover that may be disposed on the substrate to enclose the heat generating component; a metal housing that may be disposed around the shield cover; and a heat transfer member that transfers heat, which may be emitted from the heat generating component through an opening formed at a position corresponding to the heat generating component of the shield cover, to the metal housing. The shield cover may include a plurality of tension fingers that are formed to protrude at predetermined intervals to be in contact with a bottom face of the metal housing, and noise emitted from the heat generating component may be shielded by a shielding region that may be formed by the tension fingers and the metal housing. In addition, according to various embodiments, the heat generating component may be at least one module or chip set that may be included inside the electronic device, and the module or chip set may be driven according to a specific function of the electronic device, thereby generating heat.

These and other aspects of the present disclosure are more fully described hereinbelow.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
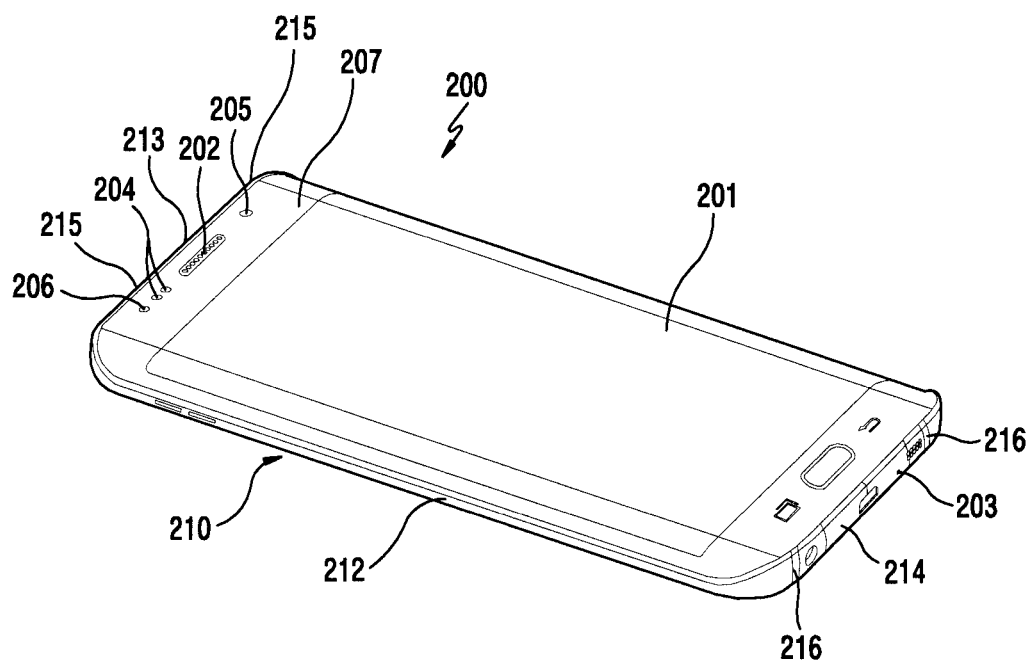
FIG. 1 is a perspective view illustrating a front side of an electronic device according to various embodiments of the present disclosure.

The following description, with reference to the accompanying drawings, is provided to assist in a comprehensive understanding of various embodiments of the present disclosure as defined by the claims and their equivalents. The description includes various specific details to assist in that understanding, but these details are to be regarded as merely exemplary. For example, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Herein, singular forms such as "a," "an," and "the" include plural referents unless the context clearly dictates otherwise. Thus, for example, reference to "a component surface" includes reference to one or more of such surfaces.

The term "substantially" indicates that the recited characteristic, parameter, or value need not be achieved exactly, but that deviations or variations, including, for example, tolerances, measurement error, measurement accuracy limitations and other factors known to those of skill in the art, may occur in amounts that do not preclude the effect the characteristic was intended to provide.

The terms "have," "may have," "include," and "may include" indicate the presence of corresponding features, numbers, functions, parts, operations, elements, etc., but do not limit additional one or more features, numbers, functions, parts, operations, elements, etc.

The terms "A or B," "at least one of A or/and B", and "one or more of A or/and B" may include any and all combinations of words enumerated with it. For example, "A or B," "at least one of A and B", and "at least one of A or B" describe (1) including A, (2) including B, or (3) including both A and B.

Although terms, such as "first" and "second" as used herein may modify various elements of various embodiments of the present disclosure, these terms do not limit the corresponding elements. For example, these terms do not limit an order and/or importance of the corresponding elements. These terms may be used for the purpose of distinguishing one element from another element. For example, a first user device and a second user device both indicate user devices and may indicate different user devices. A first element may be referred to as a second element without departing from the scope of the present disclosure, and similarly, a second element may be referred to as a first element.

When an element (e.g., a first element) is "connected to" or "(operatively or communicatively) coupled with/to" another element (e.g., a second element), the first element may be directly connected or coupled to the second element, or there may be an intervening element (e.g., a third element) between the first element and the second element. However, when the first element is "directly connected" or "directly coupled" to the second element, there is no intervening element between the first element and the second element.

The expression "configured to (or set to)" may be replaced with "suitable for," "having the capacity to," "designed to," "adapted to," "made to," or "capable of" according to the situation. The term "configured to (or set to)" does not necessarily indicate "specifically designed to" in a hardware level. Instead, the expression "an apparatus configured to . . . " may indicate that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a central processing unit (CPU) or an application processor (AP), capable of performing a corresponding operation by executing one or more software programs stored in a memory device.

All the terms used herein, including technical and scientific terms, should be interpreted to have the same meanings as commonly understood by those skilled in the art to which the present disclosure pertains, and should not be interpreted to have ideal or excessively formal meanings, unless explicitly defined herein.

A module or programming module may include at least one constituent element among the described constituent elements of an apparatus, or may omit some of them, or may further include additional constituent elements. Operations performed by a module, programming module, or other constituent elements may be executed in a sequential, parallel, repetitive, or heuristic manner. In addition, some of the operations may be executed in a different order or may be omitted, or other operations may be added.

Herein, an electronic device may be a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group phase 1 or phase 2 (MPEG-1 or MPEG-2) audio layer 3 (MP3) player, a mobile medical device, a camera, or a wearable device (e.g., a head-mounted-device (HMD), electronic glasses, electronic clothing, an electronic bracelet, an electronic necklace, an electronic appcessory, an electronic tattoo, a smart mirror, a smart watch, etc.).

An electronic device may also be a smart home appliance, e.g., a television (TV), a digital versatile disc (DVD) player, an audio component, a refrigerator, an air conditioner, a vacuum cleaner, an oven, a microwave oven, a washing machine, an air cleaner, a set-top box, a home automation control panel, a security control panel, a TV box (e.g., Samsung HomeSync®, Apple TV®, or Google TV®), a game console (e.g., Xbox® or PlayStation®), an electronic dictionary, an electronic key, a camcorder, an electronic frame, and the like.

An electronic device may also be medical equipment, such as a mobile medical device (e.g., a blood glucose monitoring device, a heart rate monitor, a blood pressure monitoring device, a temperature meter, etc.), a magnetic resonance angiography (MRA) machine, a magnetic resonance imaging (MRI) machine, a computed tomography (CT) scanner, an ultrasound machine, etc., a navigation device, a GPS receiver, an event data recorder (EDR), a flight data recorder (FDR), an in-vehicle infotainment device, electronic equipment for a ship (e.g., a ship navigation equipment and/or a gyrocompass), avionics equipment, security equipment, a head unit for vehicle, an industrial or home robot, an automatic teller machine (ATM), a point of sale (POS) device, or an Internet of things (IoT) device (e.g., a light bulb, various sensors, an electronic meter, a gas meter, a sprinkler, a fire alarm, a thermostat, a streetlamp, a toaster, a sporting equipment, a hot-water tank, a heater, a boiler, etc.)

An electronic device may also be a piece of furniture, a building/structure, an electronic substrate, an electronic signature receiving device, a projector, and/or various measuring instruments (e.g., a water meter, an electricity meter, a gas meter, a wave meter, and the like).

An electronic device may also be a combination of one or more of the above-mentioned devices. Further, it will be apparent to those skilled in the art that an electronic device is not limited to the above-mentioned examples.

Herein, the term "user" may indicate a person who uses an electronic device or a device (e.g., an artificial intelligence electronic device) that uses the electronic device.

An electronic device of a single radio environment can provide LTE service using circuit switched fall back (CSFB) that determines whether paging information of a circuit switched (CS) service network is received over an LTE network. When receiving a paging signal of the CS service network over the LTE network, the electronic device connects (or accesses) the CS service network (e.g., a 2nd generation (2G)/3rd generation (3G) network) and provides a voice call service. For example, the 2G network can include one or more of a GSM network and a code division multiple access (CDMA) network. The 3G network can include one or more of a wideband-CDMA (WCDMA) network, a time division-synchronous CDMA (TD-SCDMA) network, and an evolution-data optimized (EV-DO) network.

Alternatively, the electronic device of the single radio environment can provide LTE service using single radio LTE (SRLTE), which determines whether the paging information may be received by periodically switching every radio resource (e.g., receive antennas) to the CS service network (e.g., the 2G/3G network). Upon receiving the paging signal of the CS service network, the electronic device provides the voice call service by connecting the CS service network (e.g., the 2G/3G network).

Alternatively, the electronic device of the single radio environment can provide LTE service using single radio dual system (SRDS), which determines whether the paging information may be received by periodically switching some of radio resources (e.g., receive antennas) to the CS service network (e.g., the 2G/3G network). Upon receiving the paging signal of the CS service network, the electronic device provides the voice call service by connecting the CS service network (e.g., the 2G/3G network).

FIG. 1 is a perspective view illustrating an electronic device 200 according to various embodiments of the present disclosure.

Referring to FIG. 1, a display 201 may be provided on the front face 207 of the electronic device 200. A speaker device 202 may be disposed above the display 201 so as to receive a voice of a counterpart. A microphone device 203 may be disposed below the display 201 so as to transmit a voice of the user of the electronic device.

According to one embodiment, Components for conducting various functions of the electronic device 200 may be disposed around the speaker device 202 that may be provided on the electronic device 200. The components may include at least one sensor module 204. The sensor module 204 may include at least one of, for example, an illuminance sensor (e.g., an optical sensor), a proximity sensor, an infrared sensor, and an ultrasonic sensor. According to one embodiment, the components may include a camera device 205. According to one embodiment, the components may include an LED indicator 206 that informs the user of the status information of the electronic device 200.

According to various embodiments, the electronic device 200 may include a metal bezel 210 (that may serve as a portion of, for example, a metal housing). According to one embodiment, the metal bezel 210 may be disposed along the rim of the electronic device 200, or may be disposed on the rim to expand to at least a portion of the rear face of the electronic device 200, which extends from the rim. According to one embodiment, the metal bezel 210 defines at least a portion of the thickness of the electronic device 200 along the rim of the electronic device 200, and may be formed in a closed loop shape. Without being limited thereto, however, the metal bezel 210 may be formed to serve as at least a portion of the thickness of the electronic device 200. According to one embodiment, the metal bezel 210 may be formed on a portion of the rim of the electronic device 200. According to one embodiment, the metal bezel 210 may include one or more split portions 215 and 216 such that each of the unit bezel sections 213 and 214, which are separated by the split portions 215 and 216, may be used as an antenna radiator.

According to various embodiments, the metal bezel 210 may have a closed loop shape along the rim, and may be arranged to serve as the whole or a part of the thickness of the electronic device 200. According to one embodiment, when viewed from the front side of the electronic device 200, the metal bezel 210 may include a left bezel section 211, a right bezel section 212, an upper bezel section 213, and a lower bezel section 214. Here, the above-mentioned unit bezel sections 213 and 214 may serve as unit bezel sections that are formed by the split portions 215 and 216.

Figure 2:
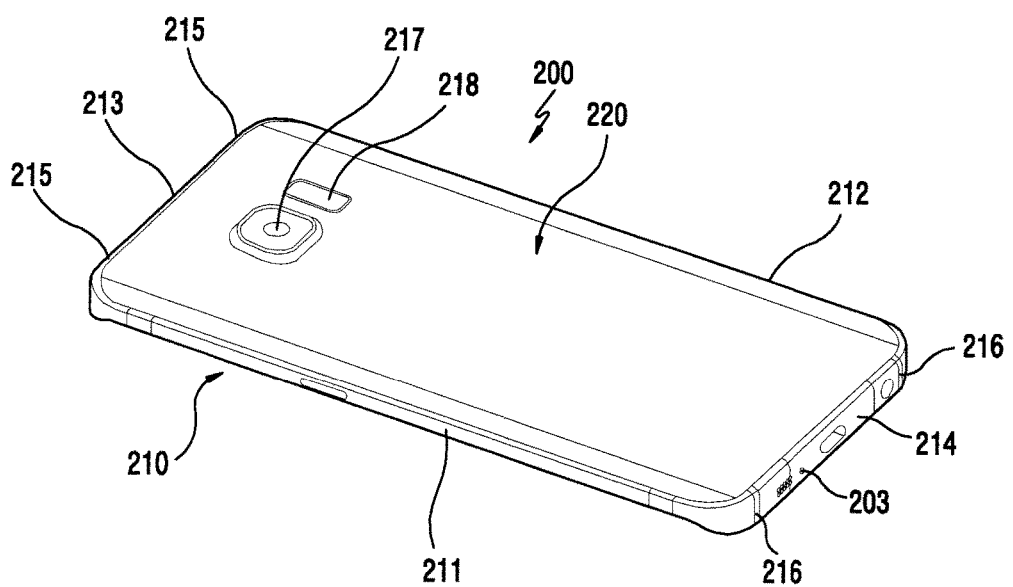
FIG. 2 is a perspective view illustrating a rear side of the electronic device according to various embodiments.

FIG. 2 is a perspective view illustrating a rear side of the electronic device 200 according to various embodiments of the present disclosure.

Referring to FIG. 2, a cover member 220 may be further provided on the second face of the electronic device 200. The cover member 220 may be a battery cover that protects a battery pack, which may be removably installed to the electronic device 200 and makes the external appearance of the electronic device 200 beautiful. Without being limited thereto, however, the cover member 220 may be integrated with the electronic device 200 to serve as a rear housing of the electronic device 200. According to one embodiment, the cover member 220 may be formed of various materials, such as a metal, glass, a composite material, and a synthetic resin. According to one embodiment, a camera device 217 and a flash 218 may be disposed on the rear face of the electronic device 200.

According to various embodiments, when the battery pack may be applied to the inside of the electronic device 200 as an integrated type, the cover member 220 may be replaced by a rear housing of the electronic device 200.

According to various embodiments, various electronic components, which may generate heat and noise, may be disposed within the electronic device. According to one embodiment, such electronic components may be mounted on a board as parts. According to one embodiment, such electronic components may include, for example, an AP, a power amplifier, a PMIC, and a graphic module, and should be designed to provide a heat dissipation measure against the heat generation and to prevent the deterioration of peripheral electronic components, which may be caused by noise.

Figure 3:
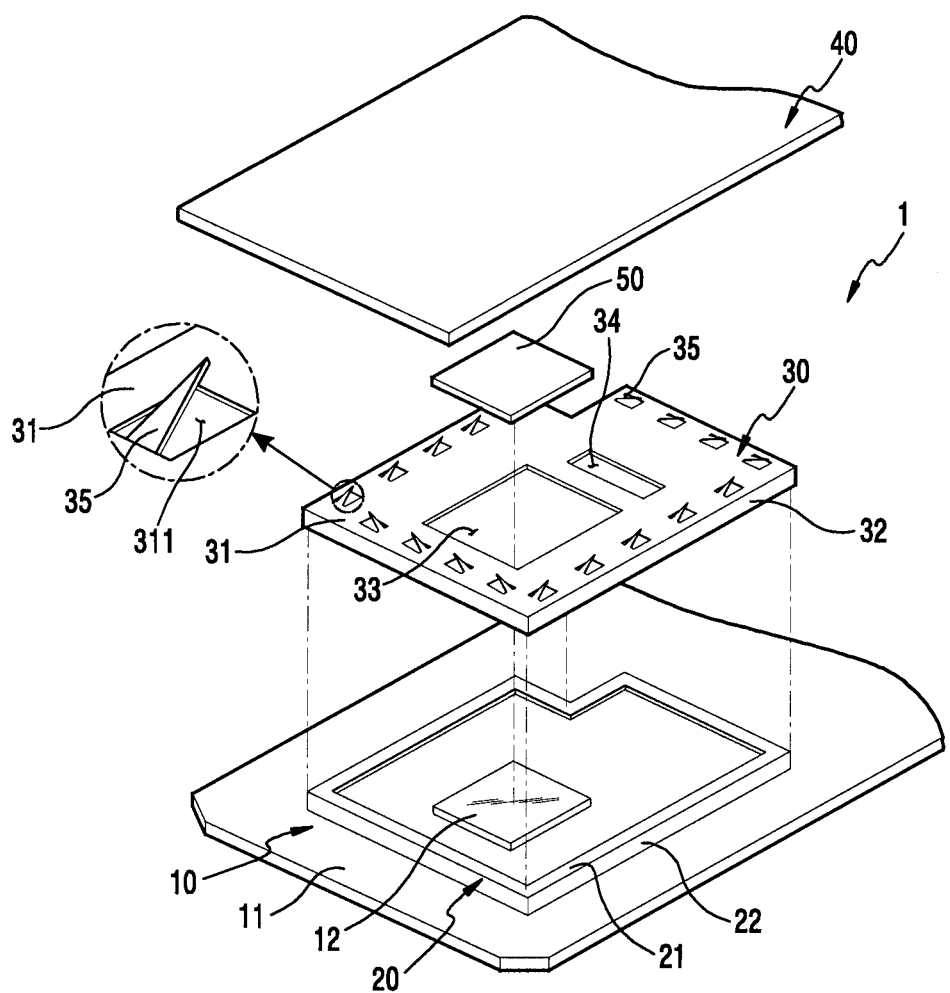
FIG. 3 is an exploded perspective view illustrating a noise shielding device according to various embodiments of the present disclosure.

FIG. 3 is an exploded perspective view illustrating a noise shielding device 1 according to various embodiments of the present disclosure. The noise shielding device 1 may be disposed within the electronic device.

Referring to FIG. 3, the noise shielding device 1 may include a board (Printed Circuit Board (PCB)) 10 on which at least one heat generating component 12 may be mounted, a shield cover 30 that may be disposed on the board 10 to enclose the heat generating component 12, and a metal housing 40 that may be disposed around the shield cover 30 to be in physical contact with the heat generating component 12 via a heat transfer member 50.

According to various embodiments, at least one heat generating component 12 may be mounted on the top surface 11 of the board 10. According to one embodiment, on the top surface 11 of the board 10, a shield frame 20 may be mounted to enclose the heat generating component 12. According to one embodiment, the shield frame 20 may be fixed to the board 10 through, for example, a soldering method or a bonding method. According to one embodiment, the shield frame 20 may be electrically connected to a ground of the board 10. Such a configuration may maximize the noise shielding effect by the shield cover 30, and may be used as an effective measure against ElectroStatic Discharge (ESD) that infiltrates through the shield cover 30 from the outside of the electronic device. According to one embodiment, the shield frame 20 may serve as a base for fixing the shield cover 30, which may be disposed above the shield frame 20. According to one embodiment, the shield frame 20 may include a top face 21 having a predetermined width along the rim thereof, and a side face 22 that may be bent downward from the top face 21 and may be fixed to the top face 21 of the board 10. According to one embodiment, the shield frame 20 may be implemented such that the heat generating component 12 may be disposed in an internal region that may be defined by the closed loop shape of the shield frame 20. According to one embodiment, the the top face 21 and the side face 22 of the shield frame 20, which enclose the heat generating component 12 mounted on the board 10, may be accommodated in the shield cover 30 in a manner of being in contact with the bottom face and inner side face 32 of the shield cover 30 to be described later, respectively. According to one embodiment, the shield frame 20 may be formed of an SUS series metallic material. According to one embodiment, a nickel silver material (an alloy material that contains at least one of copper, zinc and nickel) may be used for the shield frame 20.

According to various embodiments, the shield cover 30 may include a top face 31, and a side face 32 that may be formed by being bent along the rim of the top face 31. According to one embodiment, the shield cover 30 may include a plurality of tension fingers 35 along the periphery of the top face 31 thereof, which are formed to protrude upward. According to one embodiment, the tension fingers 35 may be integrally formed with the metallic shield cover 30. According to one embodiment, the tension fingers 35 may be formed together with the shield cover 30 by a press process when the shield cover 30 may be formed of an SUS material. According to one embodiment, each of the tension fingers 35 may have a shape that may be bent upward from a finger accommodation hole 311 formed in the shield cover 30, and may have a tension to be returned to the original position thereof even if it may be pressed downward. According to one embodiment, the shield cover 30 may include one or more openings 33 and 34 on the top face 31 thereof. According to one embodiment, the one or more openings 33 and 34 may include a first opening 33 that may be formed at a position corresponding to the heat generating component 12 mounted on the board 10, and at least one second opening 34 disposed around the first opening 33. According to one embodiment, the first opening 33 may be an opening that is capable of exposing the heat generating component 12 to the outside of the shield cover 30, and may cause the heat generating component 12 to be in physical contact with the metal housing 40 disposed outside the shield cover 30 via a heat transfer member 50. According to one embodiment, the second opening 34 may be a resin introduction opening for introducing a resin into a space between the heat generating component 12 and the board 10 when the heat generating component 12 may be mounted on the board by a Ball Grid Array (BGA) package method. Without being limited thereto, however, one or more separate openings may be disposed at various positions for the purpose of heat dissipation. For example, even if the various openings are formed at various positions on the top face 31 of the shield cover 30, it is preferable that all the openings are disposed within the internal region within the closed loop shape that is formed by the tension fingers 35. According to one embodiment, the tension fingers 35 may be formed along the periphery of the corresponding opening 33 of the shield cover 30, which may correspond to the heat generating component 12 that generates noise.

According to one embodiment, the tension fingers 35 may be formed to have an arrangement interval in the range of 2 to 5 mm. Without being limited thereto, however, the arrangement intervals of the tension fingers 35 may be determined based on the noise characteristic of the heat generating component 12 and a characteristic of an electronic component that may be disposed around the heat generating component.

According to various embodiments, the metal housing 40 may be a metal bracket that may be disposed inside the electronic device. Without being limited thereto, however, various metallic structures may be applied at a position where the structures are capable of being in physical contact with the heat transfer member 50 that may be disposed above the heat generating component 12. According to one embodiment, the metallic structures may include, for example, the housing, bezel, and battery cover, which are made of a metallic material and form the exterior appearance of the electronic device.

According to various embodiments, the heat transfer member 50 may be formed using various materials that may efficiently transfer the heat generated from the heat generating component 12 to the metal housing 40. According to one embodiment, the heat transfer member 50 may be formed using a Thermal Interface Material (TIM). According to one embodiment, as for the heat transfer member 50, for example, a TIM tape or a solid phase TIM may be used. According to one embodiment, a metallic material, which may facilitate heat conductivity, may be used for the heat transfer member 50.

Figure 4:
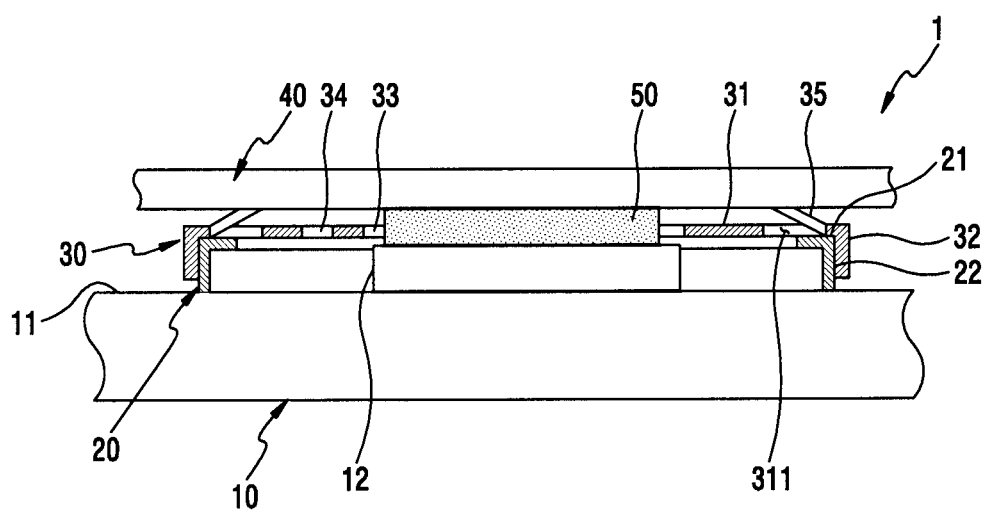
FIG. 4 is a sectional view illustrating a main portion in a state where a noise shielding device, according to various embodiments of the present disclosure, is assembled.

FIG. 4 is a sectional view illustrating a main portion in a state where a noise shielding device 1, according to various embodiments of the present disclosure, is assembled.

Referring to FIG. 4, the heat generating component 12 may be mounted on the top surface 11 of the board 10. According to one embodiment, the shield frame 20 may accommodate the shield cover 30 that is fixed to enclose the heat generating component 12, which may be disposed on the top face 11 of the board 10, within the internal region thereof. According to one embodiment, on the top of the heat generating component 12, the heat generating component 50 having a predetermined thickness may be disposed above the heat generating component 12 to be attached thereto. According to one embodiment, the heat transfer member 50 may be disposed to be at least higher than the first opening 33 that may be formed in the shield cover 30. According to one embodiment, the metal housing 40 may be disposed above the shield cover 30. According to one embodiment, if the metal housing 40 may be a metal bracket that may be disposed inside the electronic device, the metal bracket may be fixed to the board 10 or the inner surface of the external housing of the electronic device.

According to various embodiments, the tension fingers 35 may be in contact with the bottom face of the metal housing 40 while having a predetermined pressed amount by being pressed by the metal housing 40, which may be fixed above the tension fingers 35. For example, the tension fingers 35 may be designed to have a protrusion height of 0.35 mm from the top face 31 of the shield cover 30 and to have a pressed amount of 0.3 mm. In such a case, the shield cover 30 and the metal housing 40 may be designed to have a gap of 0.05 mm therebetween. This may be a considerably small gap compared to the case where a separate shielding member may be applied between the shield cover 30 and the metal housing 40, so that the entire thickness of the electronic device can be reduced.

According to various embodiments, the noise, which may be emitted through the openings 33 and 34 formed in the shield cover 30, may be efficiently shielded since a shielding region may be formed by the contact between the plurality of tension fingers 35, which are formed along the rim of the shield cover 30, and the metal housing 40.

Figure 5A:
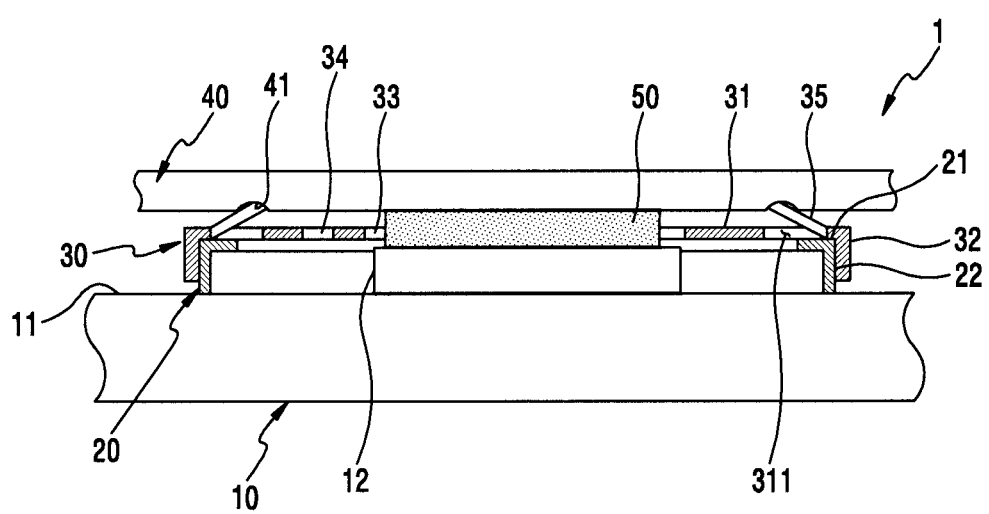
FIG. 5A, FIG. 5B, and FIG. 5C are views illustrating a contact structure between a metal housing (e.g., a metal bracket) and a shield cover, according to various embodiments of the present disclosure.
Figure 5B:
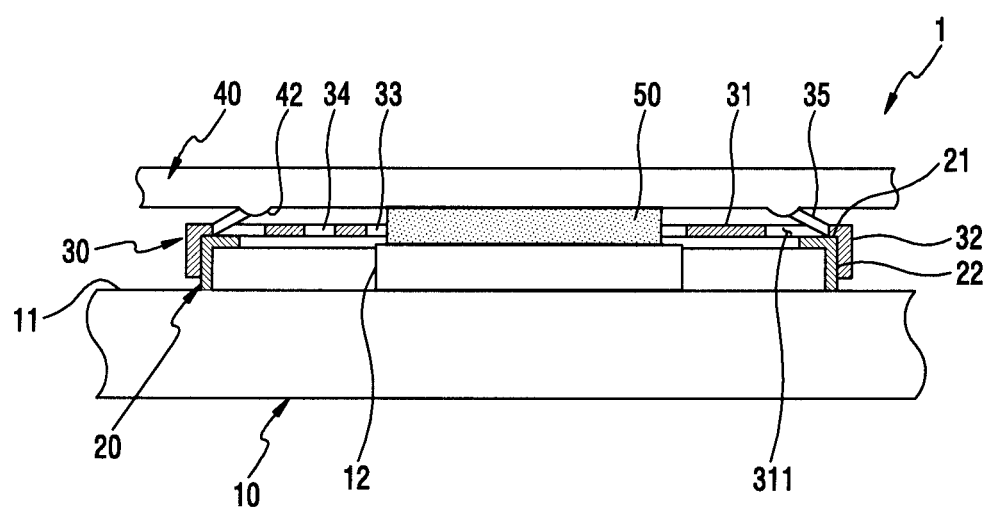
Figure 5C:
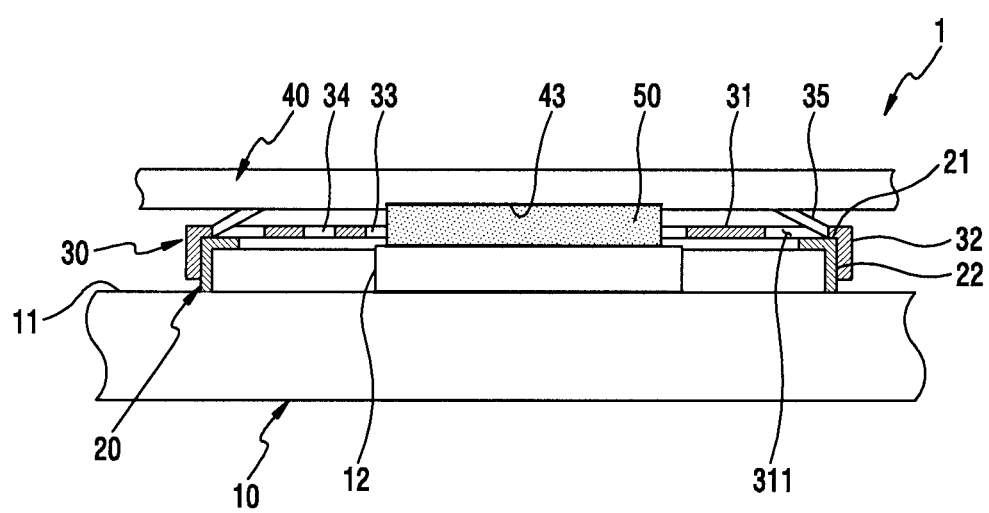

FIGS. 5A to 5C are views illustrating a contact structure between the metal housing 40 (e.g., a metal bracket) and the shield cover, according to various embodiments of the present disclosure.

Since the configuration illustrated in FIGS. 5A to 5C has generally the same as the technical configuration of the above-described noise shielding device 1, the detailed descriptions for overlapping contents will be omitted in the following description.

Referring to FIG. 5A, the metal housing 40 may have a mounting recess 41 that may be formed at a position corresponding to the tension fingers 35 in order to maintain the physical contact of the metal housing 40 with the tension fingers 35 that protrude from the top face 31 of the shield cover 30, and to guide the tension fingers 35 to assembly positions when the metal housing 40 may be mounted on the electronic device. According to one embodiment, the mounting recess 41 of the metal housing 40 may be continuously formed without being discontinued at a position corresponding to a closed loop line formed by the tension fingers 35. Alternatively, a plurality of mounting recesses 41 may be formed at the positions that correspond to the tension fingers 35, respectively.

Referring to FIG. 5B, the metal housing 40 may have a contact protrusion 42 that may be formed at a position corresponding to the tension fingers 35. According to one embodiment, the contact protrusion 42 may also guide the tension fingers 35 to assembly positions or may maintain the physical contact of the metal housing 40 with the tension fingers 35 more rigidly. According to one embodiment, the contact protrusion 42 of the metal housing 40 may be continuously formed without being discontinued at a position corresponding to a closed loop line formed by the tension fingers 35. Alternatively, a plurality of contact protrusions 41 may be formed at the positions that correspond to the tension fingers 35, respectively.

Referring to FIG. 5C, the metal housing 40 may include a member seating recess 43 on the bottom face thereof, which may be in contact with the heat transfer member 50, to accommodate the upper portion of the heat transfer member 50. Accordingly, the heat transfer member 50 may further increase the contact area with the metal housing 40 so as to guide efficient heat transfer, and the gap between the metal housing 40 and the shield cover 30 may be minimized.

Figure 6A:
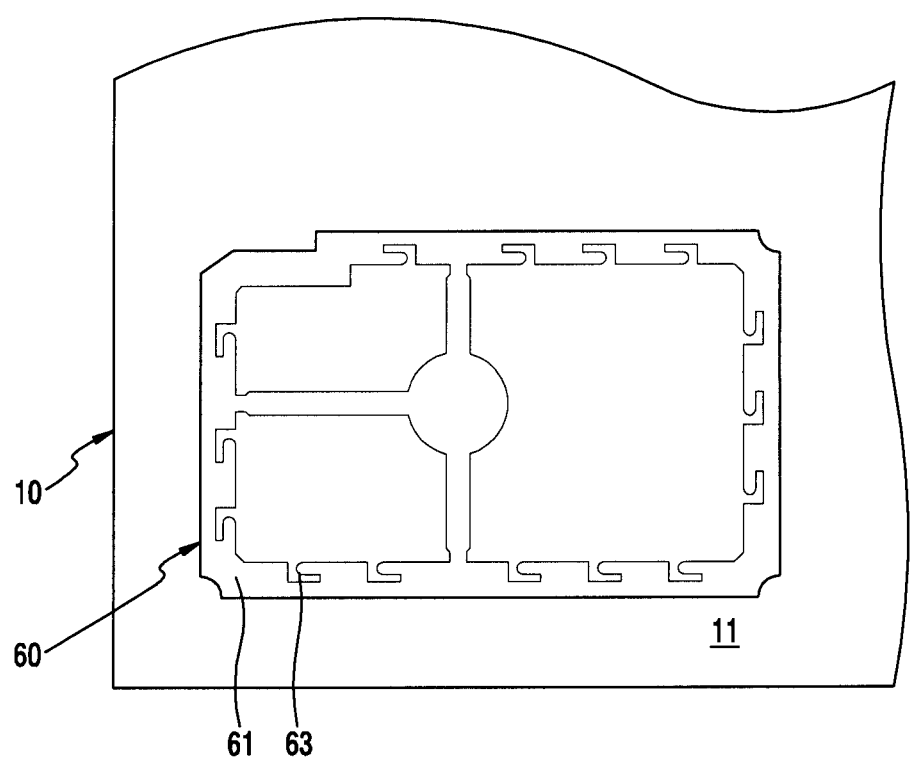
FIG. 6A is a top view illustrating a structure of a shield frame, according to various embodiments of the present disclosure.
Figure 6B:
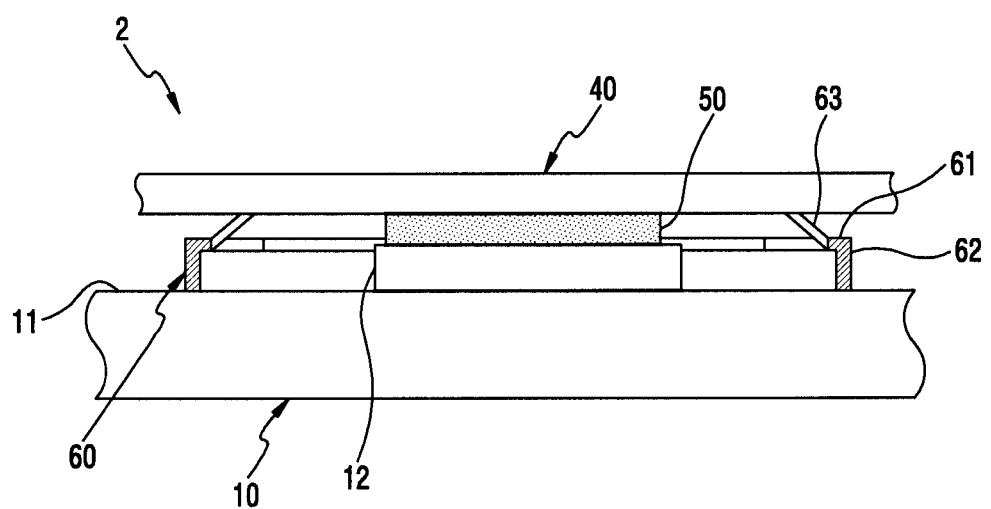
FIG. 6B is a cross-sectional view illustrating a main portion of a noise shielding structure by a shield frame, according to various embodiments of the present disclosure.

FIG. 6A is a view illustrating a structure of a shield frame 60, according to various embodiments of the present disclosure. FIG. 6B is a view illustrating a noise shielding structure by the shield frame 60, according to various embodiments of the present disclosure.

The present embodiment facilitates the noise shielding and heat dissipation structure by using the shield frame while excluding a separate shield cover.

Referring to FIGS. 6A and 6B, the shield frame 60 may be fixed to the board 10 through, for example, a soldering method or a bonding method. According to one embodiment, the shield frame 60 may be electrically connected to a ground of the board 10. According to one embodiment, the shield frame 60 may include a top face 61, and a side face 62 that may be bent downward from the top face 61 and may be fixed to the top face 11 of the board 10. According to one embodiment, the shield frame 60 may be implemented such that the heat generating component 12 may be disposed to be exposed upwardly in an internal region that may be defined by the closed loop shape of the shield frame 60.

According to various embodiments, on the top face 61 of the shield frame 60, tension fingers 63 may be arranged at predetermined intervals and may protrude upwardly to have a predetermined protrusion amount. According to one embodiment, the tension fingers 63 may be formed at arrangement intervals in the range of 2 to 5 mm. Without being limited thereto, however, the arrangement intervals of the tension fingers 63 may be determined based on the noise characteristic of the heat generating component 12 and a characteristic of an electronic component that may be disposed around the heat generating component.

According to various embodiments, the heat generating component 12 may be mounted on the top face 11 of the board 10. According to one embodiment, on the top of the heat generating component 12, the heat transfer member 50 having a predetermined thickness may be disposed above the heat generating component 12 to be attached thereto. According to one embodiment, the heat transfer member 50 may be formed to have a thickness to be at least higher than the positions of the tension fingers 63 of the shield frame 60 when the tension fingers 63 are pressed by the metal housing 40. According to one embodiment, the metal housing 40 may be directly in contact with the tension fingers 63 of the shield frame 60 such that the noise emitted from the heat generating component 12 can be efficiently shielded.

According to various embodiments, the heat transfer member 50 may be formed using various materials that may efficiently transfer the heat generated from the heat generating component 12 to the metal housing 40. According to one embodiment, the heat transfer member 50 may be formed using a Thermal Interface Material (TIM). According to one embodiment, as for the heat transfer member 50, for example, a TIM tape or a solid phase TIM may be used. According to one embodiment, a metallic material, which may facilitate heat conductivity, may be used for the heat transfer member 50.

According to various embodiments, the noise shielding device 2 may contribute to the slimming of the electronic device since it shields the noise by using the shield frame 60, excluding the shield cover.

Figure 7A:
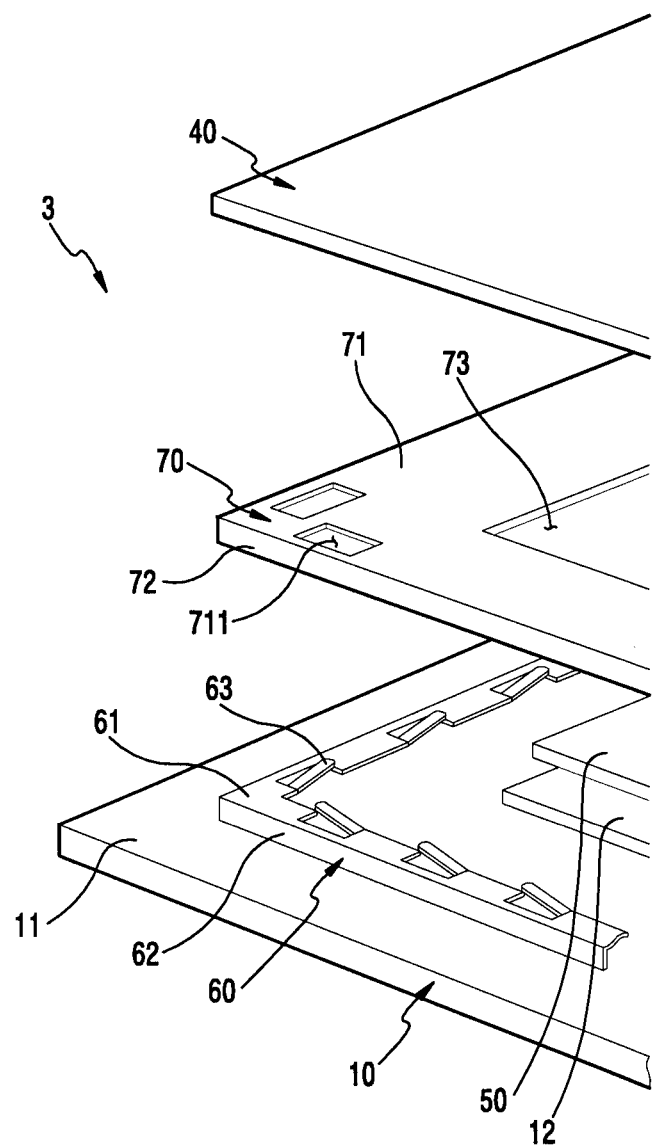
FIG. 7A is an exploded perspective view illustrating a noise shielding device according to various embodiments of the present disclosure.

FIG. 7A is an exploded perspective view illustrating a noise shielding device 3 according to various embodiments of the present disclosure.

Referring to FIG. 7A, the noise shielding device 3 may include a board (Printed Circuit Board (PCB)) 10 on which at least one heat generating component 12 may be mounted, a shield cover 70 that may be disposed on the board 10 to enclose the heat generating component 12, and a metal housing 40 that may be disposed around the shield cover 70 to be in physical contact with the heat generating component 12 via a heat transfer member 50.

According to various embodiments, at least one heat generating component 12 may be mounted on the top face 11 of the board 10. According to one embodiment, on the top surface 11 of the board 10, a shield frame 60 may be mounted to enclose the heat generating component 12. According to one embodiment, the shield frame 60 may be fixed to the board 10 through, for example, a soldering method or a bonding method. According to one embodiment, the shield frame 60 may be electrically connected to a ground of the board 10. Such a configuration may maximize the noise shielding effect by the shield cover 70, and may be used as an effective measure against ElectroStatic Discharge (ESD) that infiltrates through the shield cover 70 from the outside of the electronic device.

According to one embodiment, the shield frame 60 may serve as a base for fixing the shield cover 70, which may be disposed on the shield frame 60. According to one embodiment, the shield frame 60 may include a top face 61 having a predetermined width along the rim thereof and a side face 62 that may be bent downward from the top face 61 and may be fixed to the top face 11 of the board 10. According to one embodiment, the shield frame 60 may be implemented such that the heat generating component 12 may be disposed in an internal region that may be defined on the board 10 by the closed loop shape of the shield frame 60. According to one embodiment, the top face 61 and side face 62 of the shield frame 60, which enclose the heat generating component 12 mounted on the board 10, may accommodate the shield cover 70 in a manner of being in contact with the top face 71 and the inside of the side face of the shield cover 70, respectively.

According to various embodiments, on the top face 61 of the shield frame 60, tension fingers 63 may be arranged at predetermined intervals and may protrude upwardly to have a predetermined protrusion amount. According to one embodiment, the tension fingers 63 may be formed to have an arrangement interval in the range of 2 to 5 mm. Without being limited thereto, however, the arrangement intervals of the tension fingers 63 may be determined based on the noise characteristic of the heat generating component 12 and a characteristic of an electronic component that may be disposed around the heat generating component.

According to various embodiments, the shield cover 70 may include a top face 71 and a side face 72 that may be formed by being bent along the rim of the top face 71. According to one embodiment, the shield cover 70 may include one or more openings 73 on the top face 71 thereof. According to one embodiment, at least one opening 73 may be disposed at a position that corresponds to the heat generating component 12 mounted on the board 10. According to one embodiment, the shield cover 70 may further include, along the rim thereof, finger tension finger through-holes 711 that allow the tension fingers 63, which are formed to protrude on the shield cover, to pass therethrough. According to one embodiment, the tension fingers 63 of the shield frame 60 may pass through the finger through-holes 711 of the shield cover 70 be to be in physical contact with the metal housing 40. According to one embodiment, although not illustrated, the shield cover 70 may further include at least one resin introduction opening, as illustrated in FIG. 3.

Figure 7B:
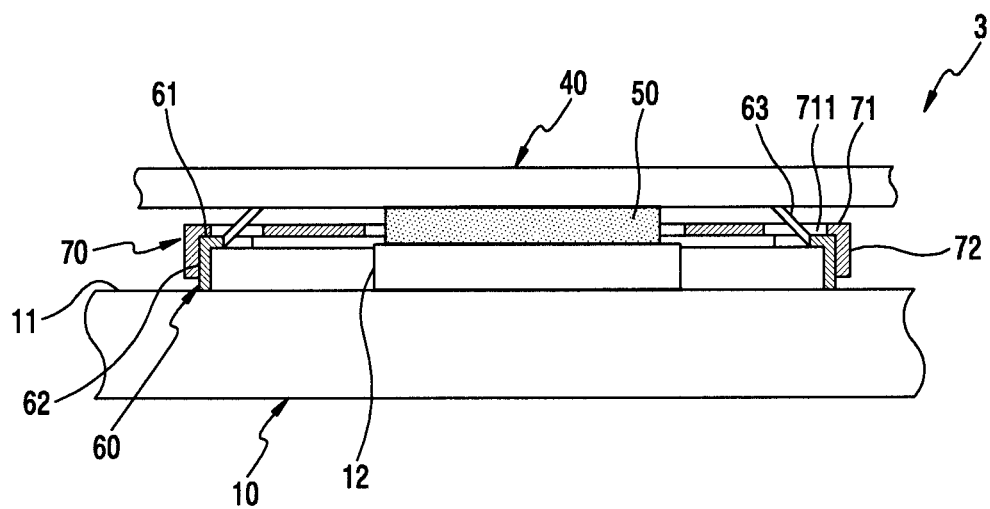
FIG. 7B is a sectional view illustrating a main portion in a state where a noise shielding device, according to various embodiments of the present disclosure, is assembled.

FIG. 7B is a sectional view illustrating a main portion in a state where the noise shielding device 3, according to various embodiments of the present disclosure, is assembled.

Referring to FIG. 7B, the heat generating component 12 may be mounted on the top face 11 of the board 10. According to one embodiment, the shield frame 60 may accommodate the shield cover 70 that may be fixed to enclose the heat generating component 12, which may be disposed on the top face 11 of the board 10, within the internal region thereof. According to one embodiment, above the heat generating component 12, the heat transfer member 50 having a predetermined thickness may be disposed above the heat generating component 12 to be attached thereto. According to one embodiment, the heat transfer member 50 may be disposed to be at least higher than the opening 73 that may be formed in the shield cover 70. According to one embodiment, the metal housing 40 may be disposed above the shield cover 70.

According to various embodiments, the tension fingers 63, which are formed to protrude upward from the shield frame 60, may be disposed to pass through the finger through-holes 711, which are formed in the shield cover 70. According to one embodiment, the tension fingers 63 may be in contact with the bottom face of the metal housing 40 while having a predetermined pressed amount by being pressed by the metal housing 40, which may be fixed above the tension fingers 63. According to one embodiment, the noise, which may be emitted through the opening 73 formed in the shield cover 70, may be efficiently shielded by a shielding region that may be formed by the contact between the plurality of tension fingers 63, which may be formed along the rim of the shield frame 60, and the metal housing 40.

Figure 8A:
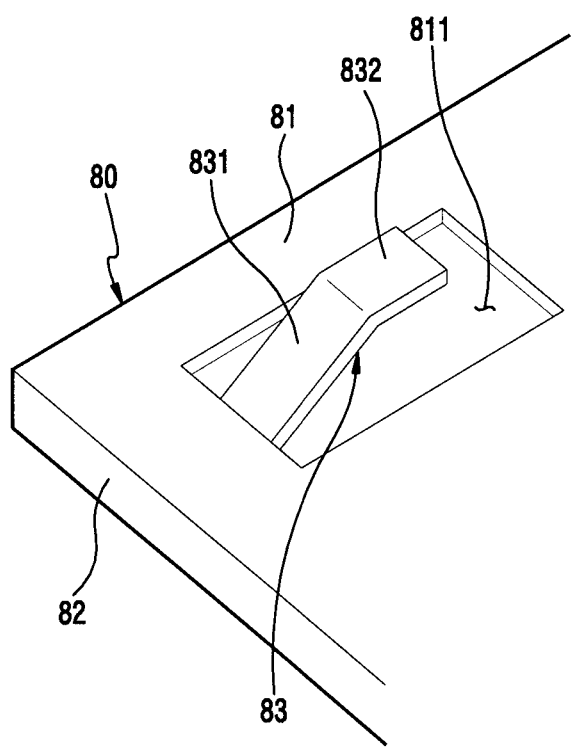
FIG. 8A, FIG. 8B, and FIG. 8C are perspective views illustrating tension fingers of a shield cover according to various embodiments of the present disclosure.
Figure 8B:
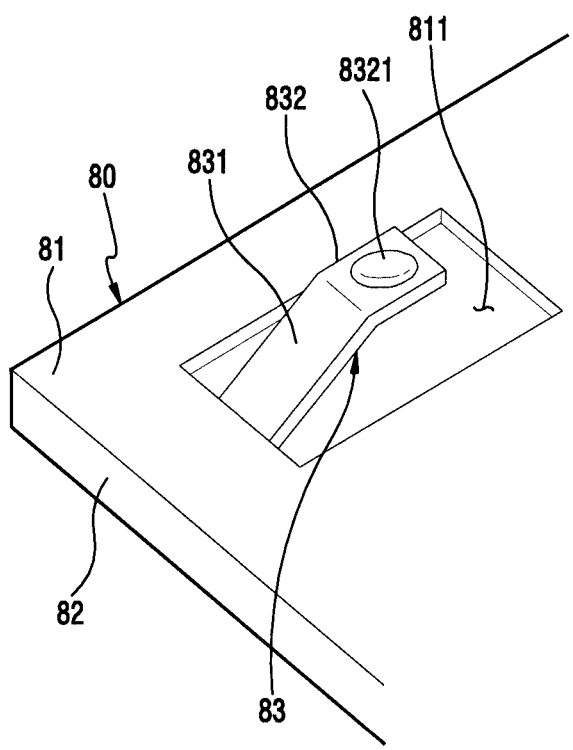
Figure 8C:
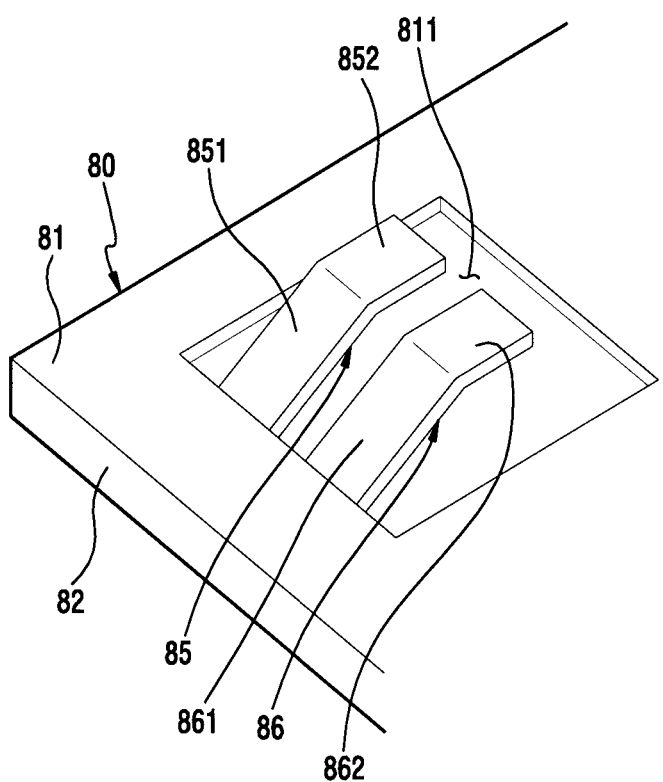

FIGS. 8A to 8C are perspective views illustrating tension fingers 83, 85, and 86 of a shield cover 80 according to various embodiments of the present disclosure.

According to various embodiments, the tension fingers may be formed through various methods. For example, the wider area of the tension fingers, which are in contact with the metal housing, may be advantageous in the heat dissipation action. According to one embodiment, the tension fingers may be in point contact or plane contact with the metal housing.

Referring to FIG. 8A, the shield cover 80 may include a side face 82 that may be formed by being bent in a predetermined height along the rim of the top face 81. According to one embodiment, finger accommodation holes 811 may be formed on the top face 81 at predetermined intervals, and tension fingers 83 may be provided to protrude upward from the finger accommodation holes 811 by a predetermined amount. According to one embodiment, each tension finger 83 may include an upwardly inclined portion 831 that may be formed to protrude upwardly at a predetermined angle from a finger accommodation hole 811, and a contact end 832 that may be bent from the upwardly inclined portion 831 and may be formed to be in plane contact with the bottom face of the metal housing. According to one embodiment, the contact end 832 may be bent in a curved shape from the upwardly inclined portion 831.

Referring to FIG. 8B, the shield cover 80 may include a side face 82 that may be formed by being bent in a predetermined height along the rim of the top face 81. According to one embodiment, Finger accommodation holes 811 may be formed on the top face 81 at predetermined intervals, and fingers 83 may be provided to protrude upward from the finger accommodation holes 811 by a predetermined amount. According to one embodiment, each tension finger 83 may include an upwardly inclined portion 831 that may be formed to protrude upwardly at a predetermined angle from a finger accommodation hole 811, and a contact end 832 that may be bent from the upwardly inclined portion 831 and may be formed to be in plane contact with the bottom face of the metal housing. According to one embodiment, an embossing 8321 may be formed to protrude on the contact end 832. According to one embodiment, the embossing 8321 may help in causing the tension finger 83 to be in more close contact with the inner face of the metal housing.

Referring to FIG. 8C, the shield cover 80 may include a side face 82 that may be formed by being bent in a predetermined height along the rim of the top face 81. According to one embodiment, Finger accommodation holes 811 may be formed on the top face 81 at predetermined intervals, and a pair of tension fingers 85 and 86 may be provided to protrude upward from each of the finger accommodation holes 811 by a predetermined amount. According to one embodiment, each of the pair of tension fingers 85 and 86 may include an upwardly inclined portion 851 or 861 that may be formed to protrude upwardly at a predetermined angle from a finger accommodation hole 811, and a contact end 852 or 862 that may be bent from the upwardly inclined portion 851 or 861 and may be formed to be in plane contact with the bottom face of the metal housing. According to one embodiment, each contact end 852 or 862 may be bent in a curved shape from the upwardly inclined portion 851 or 861. According to one embodiment, one pair of tension fingers 85 and 86 may be formed at a predetermined interval in one finger accommodation hole 811, but two or more tension fingers may be formed if it may be spatially permissible.

According to various embodiments, since noise may be shielded by the structure of the noise shielding device itself, the number of working steps can be reduced to improve productivity, costs can be reduced, a regular noise shielding function can be always effected, and the entire thickness of an electronic device can be reduced, thereby contributing to the slimming of the electronic device.

Figure 9:
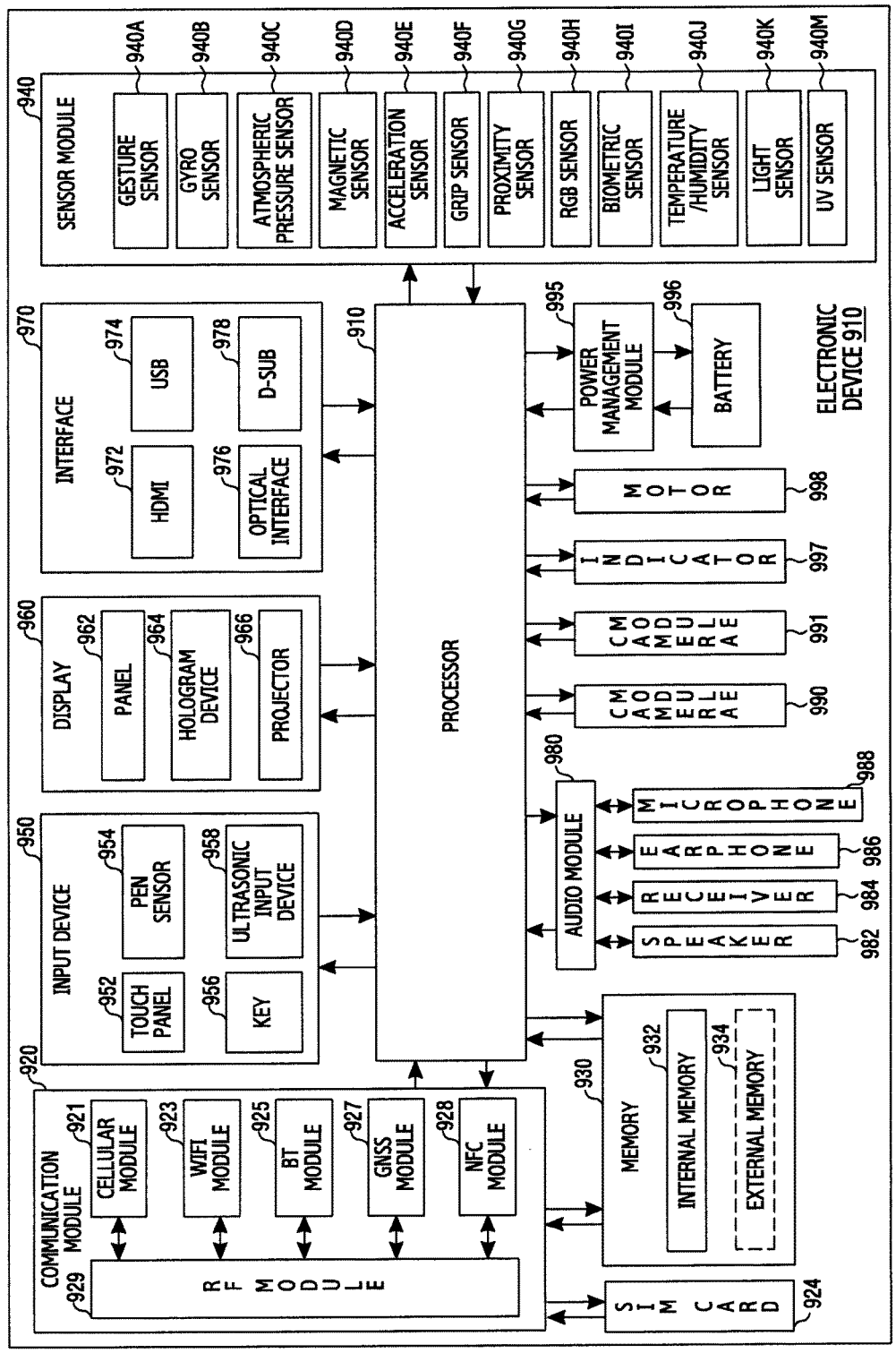
FIG. 9 is a block diagram of an electronic device according to various embodiments of the present disclosure.

FIG. 9 illustrates an electronic device according to an embodiment of the present disclosure.

Referring to FIG. 9, the electronic device 901 may include a processor 910, a communication module 920, a subscriber identification module (SIM) card 924, a memory 930, a sensor module 940, an input device 950, a display 960, an interface 970, an audio module 980, a camera module 991, a power management module 995, a battery 996, an indicator 997, and a motor 998.

The processor 910 controls a plurality of hardware or software elements connected to the processor 910 by driving an OS or an application program. The processor 910 processes a variety of data, including multimedia data, and performs arithmetic operations. The processor 910 may be implemented with a system on chip (SoC). The processor 910 may further include a Graphical processing unit (GPU).

The communication module 920 performs data transmission/reception in communication between an external electronic device or a server that may be connected with the electronic device 901 through a network. The communication module 920 includes a cellular module 921, a Wi-Fi module 923, a BT module 925, a global navigation satellite system (GNSS) or GPS module 99, a Near field communication (NFC) module 928, and a radio frequency (RF) module 929.

The cellular module 921 may provide various functionality including, for example, a voice call, a video call, a text service, an internet service, etc., through a communication network (e.g., LTE, LTE-A, CDMA, WCDMA, UMTS, WiBro, and GSM, etc.). In addition, the cellular module 921 identifies and authenticates the electronic device 901 within the communication network by using the SIM card 924. The cellular module 921 may perform at least some of functions that can be provided by the processor 910. For example, the cellular module 921 may perform at least some of multimedia control functions.

The cellular module 921 includes a CP. Further, the cellular module 921 may be implemented with an SoC. Although elements, such as the cellular module 921 (e.g., the CP), the memory 930, and the power management module 995 are illustrated as separate elements with respect to the processor 910 in FIG. 9, the processor 910 may also be implemented such that at least one part (e.g., the cellular module 921) of the aforementioned elements may be included in the processor 910.

The processor 910 or the cellular module 921 loads an instruction or data, which may be received from each non-volatile memory connected thereto or at least one of different elements, to a volatile memory, and processes the instruction or data. In addition, the processor 910 or the cellular module 921 stores data, which may be received from at least one of different elements or generated by at least one of different elements, into the non-volatile memory.

Each of the Wi-Fi module 923, the BT module 925, the GNSS module 99, and the NFC module 928 includes a processor for processing data transmitted/received through a corresponding module. Although the cellular module 921, the Wi-Fi module 923, the BT module 925, the GNSS module 99, and the NFC module 928 are illustrated in FIG. 9 as separate blocks, at least some (e.g., two or more) of the cellular module 921, the Wi-Fi module 923, the BT module 925, the GNSS module 99, and the NFC module 928 may be included in one integrated chip (IC) or IC package. For example, at least some of processors corresponding to the cellular module 921, the Wi-Fi module 923, the BT module 925, the GNSS module 99, and the NFC module 928 (e.g., a communication processor corresponding to the cellular module 921 and a Wi-Fi processor corresponding to the Wi-Fi module 923) may be implemented with an SoC.

The RF module 929 transmits/receives data, for example, an RF signal. The RF module 929 may include a transceiver, a power amp module (PAM), a frequency filter, a low noise amplifier (LNA), etc. In addition, the RF module 929 may further include a component for transmitting/receiving a radio wave on a free space in wireless communication, e.g., a conductor, a conducting wire, etc. Although FIG. 9 illustrates the cellular module 921, the Wi-Fi module 923, the BT module 925, the GNSS module 99, and the NFC module 928 sharing the RF module 929, a at least one of the cellular module 921, the Wi-Fi module 923, the BT module 925, the GNSS module 99, the NFC module 928 may transmit/receive an RF signal via a separate RF module.

The SIM card 924 may be inserted into a slot formed at a specific location of the electronic device 901. The SIM card 924 includes unique identification information (e.g., an integrated circuit card identifier (ICCID)) or subscriber information (e.g., an international mobile subscriber identity (IMSI)).

The memory 930 includes an internal memory 932 and an external memory 934.

The internal memory 932 may include at least one of a volatile memory (e.g., a dynamic random access memory (DRAM), a static RANI (SRAM), a synchronous dynamic RAM (SDRAM), etc.) or a non-volatile memory (e.g., a programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, a not or (NOR) flash memory, etc.). The internal memory 932 may be a solid state drive (SSD).

The external memory 934 may include a flash drive, and may further include a compact flash (CF), secure digital (SD), micro-SD, mini-SD, extreme digital (xD), a memory stick, etc. The external memory 934 may be operatively coupled to the electronic device 901 via various interfaces.

The electronic device 901 may further include a storage unit (or a storage medium), such as a hard drive.

The sensor module 940 measures a physical quantity or detects an operation state of the electronic device 901, and converts the measured or detected information into an electric signal. The sensor module 940 includes a gesture sensor 940A, a gyro sensor 940B, a barometric pressure sensor or air sensor 940C, a magnetic sensor 940D, an acceleration sensor 940E, a grip sensor 940F, a proximity sensor 940G a color sensor 740H (e.g., a red, green, blue (RGB) sensor), a biometric sensor 9401, a temperature/humidity sensor 940J, an illumination/illuminance sensor 940K, and an ultraviolet (UV) sensor 940M.

Additionally or alternatively, the sensor module 940 may include an E-node sensor, an electromyography (EMG) sensor, an electroencephalogram (EEG) sensor, an electrocardiogram (ECG) sensor, a fingerprint sensor, etc.

The sensor module 940 may further include a control circuit for controlling at least one or more sensors included therein.

The input device 950 includes a touch panel 952, a (digital) pen sensor 954, a key 956, and an ultrasonic input unit 958.

The touch panel 952 recognizes a touch input by using at least one of an electrostatic type configuration, a pressure-sensitive type configuration, and an ultrasonic type configuration. The touch panel 952 may further include a control circuit. When the touch panel may be an electrostatic type, physical contact recognition and proximity recognition are possible. The touch penal 952 may further include a tactile layer, which provides the user with a tactile reaction.

The (digital) pen sensor 954 may include a recognition sheet which may be a part of the touch panel or may be separated from the touch panel.

The key 956 may include a physical button, an optical key, a keypad, or a touch key.

The ultrasonic input device 958 may detect ultrasonic waves generated by an input tool through the microphone 988, and may confirm data corresponding to the detected ultrasonic waves. For example, an ultrasonic signal, which may be generated by using a pen, may be reflected off an object and detected by the microphone 988.

The electronic device 901 may use the communication module 920 to receive a user input from an external device (e.g., a computer or a server) connected thereto.

The display 960 includes a panel 962, a hologram device 964, and a projector 966.

The panel 962 may be a liquid-crystal display (LCD), an active-matrix organic light-emitting diode (AM-OLED), etc. The panel 962 may be implemented in a flexible, transparent, and/or wearable manner. The panel 962 may be constructed as one module with the touch panel 952.

The hologram device 964 uses an interference of light and displays a stereoscopic image in the air.

The projector 966 displays an image by projecting a light beam onto a screen. The screen may be located inside or outside the electronic device 901.

The display 960 may further include a control circuit for controlling the panel 962, the hologram device 964, and/or the projector 966.

The interface 970 includes an HDMI 972, a USB 974, an optical communication interface 976, and a D-subminiature (D-sub) 978. Additionally or alternatively, the interface 970 may include mobile high-definition link (MHL), SD/multimedia card (MMC) and/or infrared data association (IrDA).

The audio module 980 bilaterally converts a sound and an electric signal. The audio module 980 converts sound information which may be input or output through a speaker 982, a receiver 984, an earphone 986, the microphone 988, etc.

The speaker 982 may output a signal of an audible frequency band and a signal of an ultrasonic frequency band. Reflected waves of an ultrasonic signal emitted from the speaker 982 may be received, or a signal of an external audible frequency band may also be received.

The camera module 991 may be a device for image and video capturing, and may include one or more image sensors (e.g., a front sensor or a rear sensor), a lens, an image signal processor (ISP), or a flash (e.g., an LED or a xenon lamp). In certain instances, it may prove advantageous to include two or more camera modules.

The power management module 995 manages power of the electronic device 901. The power management module 995 may include a power management integrated circuit (PMIC), a charger IC, or a battery gauge.

The PMIC may be placed inside an IC or an SoC semiconductor. Charging may generally be classified as either wired charging or wireless charging. The charger IC charges a battery, and prevents an over-voltage or over-current flow from a charger. The charger IC includes a charger IC for at least one of the wired charging and the wireless charging.

For example, the wireless charging may include a magnetic resonance type, a magnetic induction type, or an electromagnetic type of charging. An additional circuit for the wireless charging, for example, a coil loop, a resonant circuit, a rectifier, etc., may be added.

The battery gauge may measure a residual quantity of the battery 996 and a voltage, current, and temperature during charging.

The battery 996 stores or generates electricity and supplies power to the electronic device 901 by using the stored or generated electricity. The battery 996 may include a rechargeable battery or a solar battery.

The indicator 997 indicates a specific state, for example, a booting state, a message state, a charging state, etc., of the electronic device 901 or a part thereof (e.g., the processor 910).

The motor 998 converts an electric signal into a mechanical vibration.

The electronic device 901 may include a processing unit (e.g., a GPU) for supporting mobile TV. The processing unit for supporting mobile TV may process media data according to a protocol, such as digital multimedia broadcasting (DMB), digital video broadcasting (DVB), media flow, etc.

Each of the aforementioned elements of the electronic device 901 may consist of one or more components, and names thereof may vary depending on a type of the electronic device 901. The electronic device 901 may include at least one of the aforementioned elements. Some of the elements may be omitted, or additional other elements may be further included. In addition, some of the elements of the electronic device 901 may be combined and constructed as one entity, so as to equally perform functions of corresponding elements before combination.

At least some parts of a device (e.g., modules or functions thereof) or method (e.g., operations) may be implemented with an instruction stored in a computer-readable storage media for example. The instruction may be executed by the processor 910, to perform a function corresponding to the instruction.

The computer-readable storage media may be, for example, the memory 930.

At least some parts of the programming module may be implemented (e.g., executed), for example, by the processor 910. At least some parts of the programming module may include modules, programs, routines, sets of instructions, processes, and the like, for performing one or more functions.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. An electronic device including a noise shielding device comprising:
    a substrate;
    at least one heat generating component mounted on the substrate;
    a metallic shield cover disposed on the substrate to enclose the at least one heat generating component;
    a metal housing disposed on the metallic shield cover; and
    a heat transfer member interposed between the at least one heat generating component and the metal housing,
    wherein the metallic shield cover comprises a plurality of tension fingers protruding toward the metal housing and contacting the metal housing.

2. The electronic device of claim 1, wherein the tension fingers are integrally formed with the metallic shield cover.

3. The electronic device of claim 1, wherein the substrate is mounted in an interior region of an external housing of the electronic device, and wherein the metal housing is fixedly coupled to the interior region of the external housing of the electronic device such that the metal housing is disposed on the metallic shield cover.

4. The electronic device of claim 1, wherein metallic shield cover comprises an opening, and the plurality of tension fingers are arranged along a rim of the opening of the shield cover.

5. The electronic device of claim 1, wherein the plurality of tension fingers are configured to be pressed by the metal housing by a predetermined pressed amount.

6. The electronic device of claim 4, wherein the heat transfer member is exposed through the opening, and is in physical contact with the heat generating component and the metal housing.

7. The electronic device of claim 1, wherein the heat transfer member is at least one of a Thermal Interface Material (TIM) tape, a solid phase TIM, and a metallic member.

8. The electronic device of claim 1, wherein at least one additional opening is further formed around an opening of the metallic shield cover and is configured to be used as a resin introduction opening of the heat generating component or to assist heat dissipation.

9. The electronic device of claim 1, wherein at least one of a mounting recess and a contact protrusion is formed on a surface facing the metallic shield cover of the metal housing, the at least one of the mounting recess and the contact protrusion being in contact with each of the plurality of tension fingers.

10. The electronic device of claim 1, wherein the metallic shield cover further comprise a finger accommodation hole positioned at a surface facing the metal housing,
    wherein each of the tension fingers is extended from an edge of the finger accommodation hole, the each of the tension finger comprising an upwardly inclined portion that is bent upwardly at a predetermined angle at the edge; and
    a contact end extending from the upwardly inclined portion at a predetermined angle such that the contact end is in plane contact with a surface facing the metallic shield cover of the metal housing.

11. The electronic device of claim 10, wherein at least two tension fingers are extendedly formed at a predetermined interval in the finger accommodation hole.

12. The electronic device of claim 1, wherein the shield cover is fixedly coupled to a shield frame that is disposed on the substrate.

13. The electronic device of claim 1, wherein the heat generating component comprises at least one module or chip set, and the module or chip set is driven according to a specific function of the electronic device, thereby generating heat.

14. The electronic device of claim 10, wherein a contact protrusion is formed on the contact end of each of the plurality of tension fingers.

15. The electronic device of claim 1, wherein the electronic device is a mobile communication device that comprises:
    a sound output unit that outputs sound data processed inside the electronic device;
    a power supply that is electrically connected to the electronic device to supply power;
    a voice input unit that receives a voice signal from the outside of the electronic device;
    an image input unit that receives an image signal that is input to the electronic device; and
    a communication unit that exchanges data with another electronic device.

16. An electronic device including a noise shielding device comprising:
    a substrate;
    at least one heat generating component mounted on the substrate;
    a metallic shield frame including an internal region enclosing the heat generating component within the internal region;
    a metal housing disposed on the metallic shield frame; and
    a heat transfer member interposed between the at least one heat generating component and the metal housing,
    wherein the metallic shield frame comprises a plurality of tension fingers protruding toward the metal housing and contacting the metal housing.

17. The electronic device of claim 16, wherein the plurality of tension fingers are configured to be pressed by the metal housing by a predetermined pressed amount.

18. The electronic device of claim 16, wherein the electronic device is a mobile communication device that comprises:
    a sound output unit that outputs sound data processed inside the electronic device;
    a power supply that is electrically connected to the electronic device to supply power;
    a voice input unit that receives a voice signal from the outside of the electronic device;
    an image input unit that receives an image signal that is input to the electronic device; and
    a communication unit that exchanges data with another electronic device.

19. An electronic device including a noise shielding device comprising:
    a substrate;
    at least one heat generating component mounted on the substrate;
    a metallic shield frame including an internal region, enclosing the heat generating component within the internal region;

a metallic shield cover fixedly coupled to the metallic shield frame to cover the metallic shield frame, the metallic shield cover comprising an opening at a position corresponding to the heat generating component;

a metal housing disposed on the metallic shield cover; and a heat transfer member interposed between the heat generating component and the metal housing, wherein the metallic shield frame comprises a plurality of tension fingers protruding toward the metal housing and penetrating finger through-holes, the finger through-holes being formed in the shield cover at corresponding positions, the tension fingers being in contact with the metal housing.

20. The electronic device of claim 19, wherein the electronic device is a mobile communication device that comprises:

a sound output unit that outputs sound data processed inside the electronic device;

a power supply that is electrically connected to the electronic device to supply power;

a voice input unit that receives a voice signal from the outside of the electronic device;

an image input unit that receives an image signal that is input to the electronic device; and a communication unit that exchanges data with another electronic device.

\* \* \* \* \*